(12) United States Patent
Aikawa et al.

(10) Patent No.: US 9,202,718 B2
(45) Date of Patent: *Dec. 1, 2015

(54) ELECTROSTATIC CHUCK

(71) Applicant: NGK INSULATORS, LTD., Nagoya (JP)

(72) Inventors: Kenichiro Aikawa, Handa (JP); Morimichi Watanabe, Nagoya (JP); Asumi Jindo, Okazaki (JP); Yuji Katsuda, Tsushima (JP); Yosuke Sato, Hashima (JP); Yoshinori Isoda, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 150 days.

This patent is subject to a terminal disclaimer.

(21) Appl. No.: 13/864,467

(22) Filed: Apr. 17, 2013

(65) Prior Publication Data

US 2013/0229746 A1  Sep. 5, 2013

Related U.S. Application Data

(63) Continuation of application No. PCT/JP2011/073768, filed on Oct. 11, 2011.

(30) Foreign Application Priority Data

Oct. 25, 2010  (JP) ................................ 2010-239000
Jun. 17, 2011  (JP) ................................ 2011-35312
Aug. 29, 2011  (WO) ................. PCT/JP2011/069479

(51) Int. Cl.
  *H01L 21/683*  (2006.01)
  *H01L 21/67*  (2006.01)
  (Continued)

(52) U.S. Cl.
  CPC ............. *H01L 21/67* (2013.01); *B32B 18/00* (2013.01); *C04B 35/58* (2013.01); *C04B 35/581* (2013.01);
  (Continued)

(58) Field of Classification Search
  CPC .......................... C04B 35/581; C23C 14/3414
  USPC ........................................................ 361/234
  See application file for complete search history.

(56) References Cited

U.S. PATENT DOCUMENTS 3,531,245 A  9/1970  Dietz
5,231,062 A  7/1993  Mathers et al.
(Continued)

FOREIGN PATENT DOCUMENTS

JP  62-028917 A1  2/1987
JP  04-304359 A1  10/1992
(Continued)

OTHER PUBLICATIONS

Arielle Granon, et al., "*Aluminum Magnesium Oxynitride: A New Transparent Spinel Ceramic,* " Journal of the European Ceramic Society, vol. 15, 1995, pp. 249-254.
(Continued)

*Primary Examiner* — Thienvu Tran
*Assistant Examiner* — Tien Mai
(74) *Attorney, Agent, or Firm* — Burr & Brown, PLLC

(57) ABSTRACT

An electrostatic chuck 1A includes a susceptor 11A having an adsorption face 11a of adsorbing a semiconductor, and an electrostatic chuck electrode 4 embedded in the susceptor. The susceptor 11A includes a plate shaped main body 3 and a surface corrosion resistant layer 2 including the adsorption face 2. The surface corrosion resistant layer 2 is made of a ceramic material comprising magnesium, aluminum, oxygen and nitrogen as main components. The ceramic material comprises a main phase comprising magnesium-aluminum oxynitride phase exhibiting an XRD peak at least in $2\theta=47$ to $50°$ by CuK$\alpha$ X-ray.

11 Claims, 8 Drawing Sheets
(1 of 8 Drawing Sheet(s) Filed in Color)

(51) Int. Cl.

| | | |
|---|---|---|
| *C04B 35/581* | (2006.01) | |
| *H05B 1/00* | (2006.01) | |
| *B32B 18/00* | (2006.01) | |
| *H05B 3/28* | (2006.01) | |
| *C04B 35/58* | (2006.01) | |
| *C04B 35/626* | (2006.01) | |
| *C04B 35/645* | (2006.01) | |
| *C04B 37/00* | (2006.01) | |
| *C23C 14/34* | (2006.01) | |

(52) U.S. Cl.
CPC ....... *C04B 35/6261* (2013.01); *C04B 35/62655* (2013.01); *C04B 35/645* (2013.01); *C04B 37/001* (2013.01); *C04B 37/003* (2013.01); *C23C 14/3414* (2013.01); *H01L 21/6831* (2013.01); *H05B 1/00* (2013.01); *H05B 3/283* (2013.01); *C04B 2235/3206* (2013.01); *C04B 2235/3217* (2013.01); *C04B 2235/3222* (2013.01); *C04B 2235/3225* (2013.01); *C04B 2235/3865* (2013.01); *C04B 2235/5445* (2013.01); *C04B 2235/77* (2013.01); *C04B 2235/80* (2013.01); *C04B 2235/96* (2013.01); *C04B 2235/9607* (2013.01); *C04B 2237/08* (2013.01); *C04B 2237/34* (2013.01); *C04B 2237/343* (2013.01); *C04B 2237/36* (2013.01); *C04B 2237/366* (2013.01); *C04B 2237/58* (2013.01); *C04B 2237/704* (2013.01); *C04B 2237/708* (2013.01); *C04B 2237/72* (2013.01); *Y10T 428/24942* (2013.01)

(56) References Cited

U.S. PATENT DOCUMENTS

| | | | |
|---|---|---|---|
| 5,314,675 A | 5/1994 | Dubots et al. | |
| 5,336,280 A | 8/1994 | Dubots et al. | |
| 5,457,075 A | 10/1995 | Fukushima et al. | |
| 5,721,062 A | 2/1998 | Kobayashi | |
| 6,071,465 A | 6/2000 | Kobayashi | |
| 6,239,402 B1 | 5/2001 | Araki et al. | |
| 6,447,937 B1 | 9/2002 | Murakawa et al. | |
| 7,122,490 B2 * | 10/2006 | Kobayashi et al. | 501/98.4 |
| 7,255,934 B2 | 8/2007 | Hatono et al. | |
| 7,473,661 B2 * | 1/2009 | Lee et al. | 501/98.5 |
| 2001/0055190 A1 | 12/2001 | Saito et al. | |
| 2003/0049499 A1 | 3/2003 | Murakawa et al. | |
| 2003/0128483 A1 | 7/2003 | Kamijo | |
| 2003/0183615 A1 | 10/2003 | Yamaguchi et al. | |
| 2005/0173412 A1 | 8/2005 | Kondou et al. | |
| 2006/0240972 A1 | 10/2006 | Lee et al. | |
| 2007/0258281 A1 | 11/2007 | Ito et al. | |
| 2008/0124454 A1 | 5/2008 | Djayaprawira et al. | |
| 2010/0104892 A1 | 4/2010 | Kobayashi et al. | |

FOREIGN PATENT DOCUMENTS

| | | |
|---|---|---|
| JP | 05-319937 A1 | 12/1993 |
| JP | 06-037207 A1 | 2/1994 |
| JP | 08-073280 A1 | 3/1996 |
| JP | 09-219369 A1 | 8/1997 |
| JP | 2000-044345 A1 | 2/2000 |
| JP | 2001-308167 A1 | 11/2001 |
| JP | 2003-288975 A1 | 10/2003 |
| JP | 3559426 B2 | 9/2004 |
| JP | 2005-203456 A1 | 7/2005 |
| JP | 2006-080116 A1 | 3/2006 |
| JP | 2007-084367 A1 | 4/2007 |
| JP | 2007-300079 A1 | 11/2007 |
| JP | 2008-115065 A1 | 5/2008 |
| JP | 2009-292688 A1 | 12/2009 |

OTHER PUBLICATIONS

J. Weiss, et al., "The System Al—Mg—O—N," Communications of the American Ceramic Society, vol. 65, May 1982, C68-C69.
Guotian Ye, et al., "Synthesis and Oxidation Behavior of MgAlON Prepared from Different Starting Materials," J. Am. Ceram, Soc., vol. 93, No. 2, 2010, pp. 322-325.
International Search Report and Written Opinion dated Nov. 15, 2011.
U.S Appl. No. 13/863,729, filed Apr. 16, 2013, Kondo et al.
U.S Appl. No. 13/863,803, filed Apr. 16, 2013, Kondo et al.
U.S Appl. No. 13/864,559, filed Apr. 17, 2013, Kondo et al.
U.S Appl. No. 13/869,285, filed Apr. 24, 2013, Aikawa et al.
U.S Appl. No. 13/478,508, filed May 23, 2012, Watanabe et al.
U.S Appl. No. 13/478,591, filed May 23, 2012, Watanabe et al.
"Refractory Products," published by Chemical Industry Publisher, dated Jan. 31, 2010 (3 pages).
Chinese Office Action (With English Translation), Chinese Application No. 201180051175.X, dated Mar. 9, 2015 (15 pages).

* cited by examiner

Fig. 8
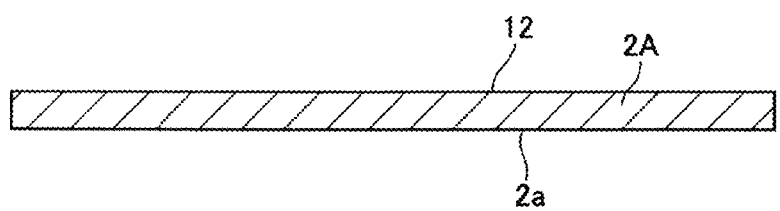
(a)
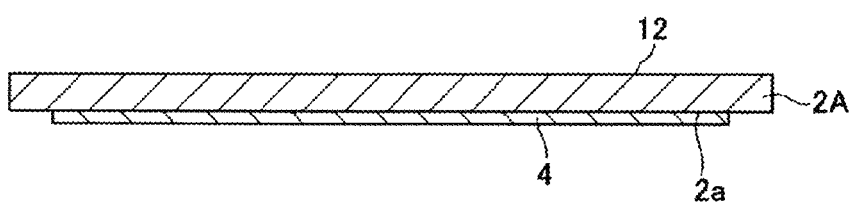
(b)
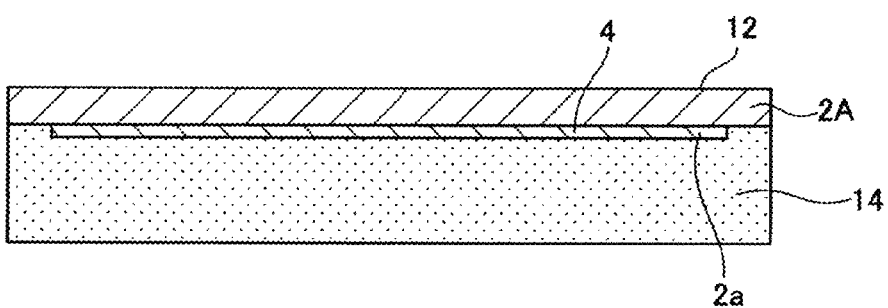
(c)
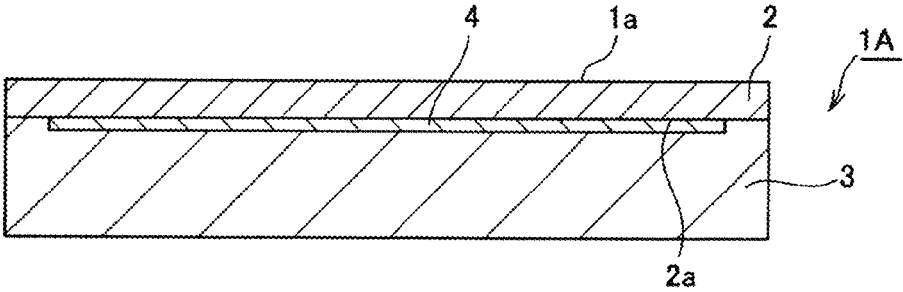
(d)

ELECTROSTATIC CHUCK

BACKGROUND OF THE INVENTION

1. Field of the Invention

The present invention relates to an electrostatic chuck device of adsorbing and processing a semiconductor.

2. Description of Related Art

In a system of producing semiconductors used for dry process or plasma coating in semiconductor production, it has been used halogen-based plasma such as F, Cl or the like having high reactivity for etching or cleaning. It is thus required, for a member equipped to such semiconductor production system, high corrosion resistance, so that it has been generally used a member of an anti-corrosive metal such as aluminum with alumite treatment, HASTELLOY or the like or a ceramic material. Especially, it is necessary high corrosion resistance and low particle generation properties for an electrostatic chuck or heater member supporting and fixing an Si wafer, so that it has been used a high corrosion resistant ceramic member such as aluminum nitride, alumina, sapphire or the like. As these materials are used for a long time, they are gradually corroded to induce particle generation, so that it has been demanded a material whose corrosion resistance is further improved. For attending such demands, it has been studied to use, as the material, magnesia, spinel ($MgAl_2O_4$) or a composite material thereof whose corrosion resistance is higher than that of alumina (For example, Patent document 1; U.S. Pat. No. 3,559,426B).

In a production procedure of a semiconductor device, a semiconductor is adsorbed and held on a wafer mounting face of an electrostatic chuck, and the adsorbed and held semiconductor wafer is subjected to various treatments such as heating or etching treatment. According to an electrostatic chuck, an electrostatic electrode is embedded within a disk shaped ceramic substrate having a wafer mounting face for generating an electrostatic force on the wafer mounting face. A heater electrode (referred to as resistance heating member) is optionally embedded therein for heating the wafer mounting face. As to the ceramic substrate, it has been proposed those made of alumina sintered body and aluminum nitride sintered body, as well as those made of materials with high corrosion resistance against fluorine such as yttria sintered body and magnesia sintered body, for example, considering that the electrostatic chuck is used under condition of contacting a gas containing fluorine. For example, according to Japanese Patent Publication No. 2001-308167A, it is proposed an electrostatic chuck of Johnson-Lahbeck type using a ceramics containing magnesia (MgO) as its main phase.

SUMMARY OF THE INVENTION

According to conventional semiconductor production processes, for preventing contamination of a wafer, it has been used a strongly corrosive gas such as halogen based gas for cleaning a system. Further, it is demanded temperature uniformity on wafer for forming a film uniformly on the wafer.

As a member for supporting and further heating an Si wafer in a system for producing semiconductors, it has been widely used a ceramic heater with a ceramic electrostatic chuck made of AlN (aluminum nitride) as described above as an existing art. It is thereby possible to obtain good temperature uniformity on wafer in the initial stage of use. However, AlN is corroded due to cleaning by a corrosive gas so that the shape and roughness of the heater surface is changed. The temperature distribution is thereby changed as the use time passes so that the temperature uniformity cannot be maintained and the adsorption force is deteriorated, which is problematic.

An object of the present invention is, in an electrostatic chuck used for semiconductor processing, to maintain good temperature uniformity for a long period of time and to prevent deterioration of adsorption force, when it is used under atmosphere of a halogen based corrosive gas or its plasma.

The present invention provides an electrostatic chuck comprising a susceptor having an adsorption face adsorbing a semiconductor and an electrostatic chuck electrode embedded within the susceptor. The susceptor includes a plate shaped main body and a surface corrosion resistant layer including the adsorption face. The surface corrosion resistance layer is composed of a ceramic material comprising main components comprising magnesium, aluminum, oxygen and nitrogen, and the ceramic material comprises a main phase comprising magnesium-aluminum oxynitride phase exhibiting an XRD peak at least in $2\theta=47$ to $50°$ taken by using $CuK\alpha$ ray.

The ceramic material of the present invention includes the magnesium-aluminum oxynitride phase as the main phase, and more superior in corrosion resistance against a strongly corrosive gas such as a halogen based gas or the like compared with aluminum nitride. By forming the surface corrosion resistant layer of the susceptor with this ceramic material, it is resistive against the change of the surface state due to the corrosion even in the case that it is used under corrosive condition for a long time. It is thereby possible to obtain good temperature uniformity on wafer and adsorption force for a long time.

Further, the plate shaped main body may be formed with a material with a high thermal conductivity and different from the ceramic material, so that it is possible to facilitate thermal conduction in planar directions on the susceptor to further improve the temperature uniformity on wafer.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 8(*a*), (*b*), (*c*) and (*d*) are diagrams illustrating preferred production procedure of an electrostatic chuck.

DETAILED DESCRIPTION OF THE INVENTION

Figure 1:
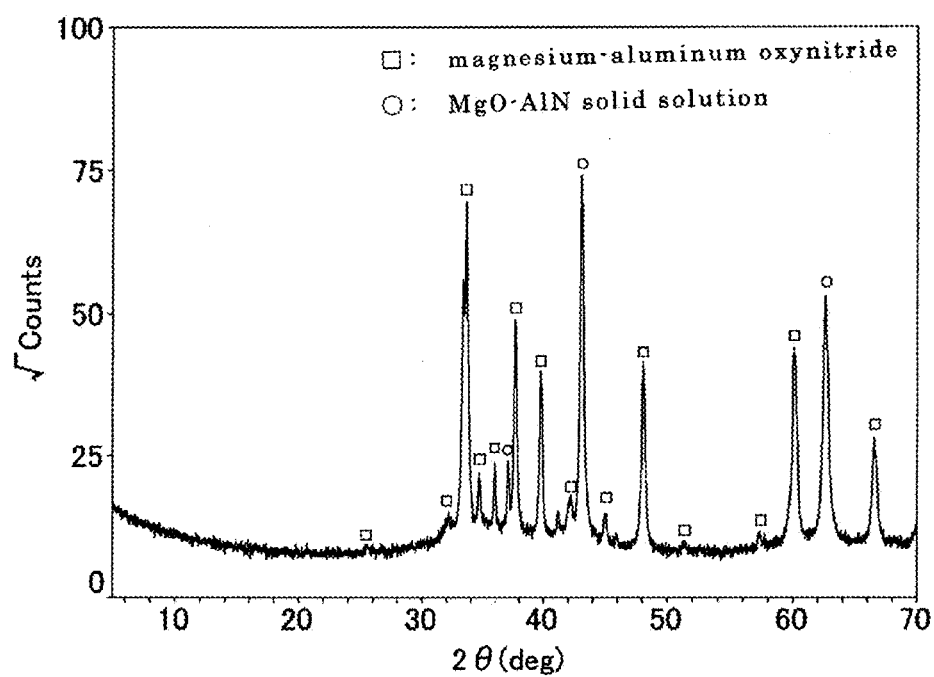
FIG. 1 is an XRD analytical chart obtained in Experiment 1.

The novel ceramic material used in the present invention will be described first, and details of the heating apparatus will be described later.

(Ceramic Material)

The inventors intensively studied corrosion resistance of a ceramic material produced by molding a mixture of magnesium oxide, alumina and aluminum nitride powders and by sintering the mold by hot press sintering. As a result, it was found that considerably high corrosion resistance can be obtained by the ceramic material including a main phase composed of magnesium-aluminum oxynitride having an XRD peak at a specific position.

That is, the inventive ceramic material comprises main components comprising magnesium, aluminum, oxygen and nitrogen, and the ceramic material comprises a main phase comprising magnesium-aluminum oxynitride phase exhibiting an XRD peak at least in $2\theta=47$ to $50°$ taken by using CuK$\alpha$ ray.

The ceramic material of the present invention has corrosion resistance comparable with, or superior than, that of spinel. Therefore, the inventive susceptor can endure against halogen based plasma such as F, Cl or the like used in a semiconductor production process for a long time, so that it is possible to reduce an amount of particles generated from the susceptor member. Moreover, even when the susceptor is used for a long time under corrosive condition, the change of the surface state due to corrosion can be reduced, so that it is possible to obtain good temperature uniformity on a wafer for a long time.

The inventive ceramic material includes main components including magnesium, aluminum, oxygen and nitrogen, and the ceramic material includes a main phase comprising the magnesium-aluminum oxynitride phase exhibiting an XRD peak at least in $2\theta=47$ to $50°$ taken by using CuK$\alpha$ ray. As the magnesium-aluminum oxynitride has corrosion resistance against halogen based plasma comparable with, or superior than, that of spinel, it is considered that the inventive ceramic material including the oxynitride as its main phase also exhibits high corrosion resistance. Further, the magnesium-aluminum oxynitride has corrosion resistance comparable with that of spinel, and at the same time, can have a linear thermal expansion coefficient lower than that of spinel.

The inventive ceramic material may contain, as a sub phase, crystal phase of MgO—AlN solid solution composed of magnesium oxide to which aluminum nitride is dissolved. The MgO—AlN solid solution is also anti-corrosive, so that it is not problematic if it is contained as a sub phase. The XRD peaks at (200) and (220) faces of the MgO—AlN solid solution taken by using CuK$\alpha$ ray may be observed in ranges of $2\theta=42.9$ to $44.8°$ and 62.3 to $65.2°$, respectively, which are between peaks of cubic phase of magnesium oxide and cubic phase of aluminum nitride, respectively. Further, XRD peak at (111) face may be observed in a range of $2\theta=36.9$ to $39°$, which is between peaks of cubic phase of magnesium oxide and cubic phase of aluminum nitride. Since it may be difficult to distinguish the peak at (111) face from the peaks corresponding with the other crystalline phases, only the XRD peaks at (200) face and (220) face may be observed in the above ranges. Similarly, it may be difficult to distinguish the peak at (200) face or the peak at (220) face from the peaks corresponding with the other crystalline phases.

In the inventive ceramic material, for obtaining corrosion resistance comparable with, or higher than, that of spinel, the content of AlN crystal phase may preferably be lower and more preferably AlN crystal phase is not contained, because the corrosion resistance tends to be deteriorated in the case that AlN crystal phase is contained as the sub phase. Further, since the corrosion resistance of spinel is higher than those of alumina and AlN crystals, a small amount of spinel may be contained. However, since the corrosion resistance of spinel is inferior to that of the inventive magnesium-aluminum oxynitride phase or MgO—AlN solid solution, it is preferred that the content of spinel is lower. On the other hand, for lowering the linear thermal expansion coefficient while maintaining the corrosion resistance comparable with that of spinel, a small amount of spinel or AlN crystal phase may be contained.

In the inventive ceramic material, for obtaining corrosion resistance comparable with, or higher than, that of spinel, a molar ratio of magnesium/aluminum in powdery raw material may preferably be 0.20 or higher and 2 or lower, and more preferably be 0.75 or higher and 2 or lower. In the case that the molar ratio of magnesium/aluminum is lower than 0.20, it might be concerned that an amount of generation of either of aluminum nitride, spinel and aluminum nitride would become large to result in reduction of the superior anti-corrosion characteristics. In the case that the molar ratio of magnesium/aluminum exceeds 2, the MgO—AlN solid solution tends to become a main phase. On the other hand, for lowering the linear thermal expansion coefficient while maintaining the corrosion resistance comparable with that of spinel, the molar ratio of magnesium/aluminum in the powdery raw material may preferably be 0.05 or higher and 1.5 or lower, and more preferably be 0.1 or higher and 1 or lower.

An open porosity of the inventive ceramic material may preferably be 5% or lower. Here, the open porosity means a value measured by Archimedean method using pure water as a medium. In the case that the open porosity exceeds 5%, there would be a risk that the strength is lowered or the material itself would become susceptible to removal of grains and the resultant particle generation, and particle components tends to be stored in the pores during the processing of the material, which is not preferred. Further, it is preferred that the open porosity is nearer to zero as possible. The lower limit of it is not particularly defined.

According to the inventive ceramic material, the linear thermal expansion coefficient of the magnesium-aluminum oxynitride forming the main phase in a range of 40 to 1000° C. is 6 to 7 ppm/K. Thus, by changing the ratios of the sub-components such as the MgO—AlN solid solution (12 to 14 ppm/K), spinel (8 to 9 ppm/K), and aluminum nitride (5 to 6 ppm/K), the linear thermal expansion coefficient can be controlled in a range of 5.5 to 10 ppm/K while maintaining the high corrosion resistance. However, since spinel or aluminum nitride is lower in the corrosion resistance than the magnesium-aluminum oxynitride or MgO—AlN solid solution, the contents thereof may be preferably smaller. By adjusting the thermal expansion as such, it is possible to match the thermal expansion with those of aluminum oxide, yttrium oxide and aluminum nitride used for members for semiconductor production systems. Alternatively, the difference of the thermal expansion coefficients can be reduced. By these, it is possible to laminate or adhere the inventive ceramic material onto a prior material. It is thereby possible to use the inventive ceramic material with high corrosion resistance for a surface part (first structural body) and to use the prior material as a base material for a lower part (second structural body). Such layered structure and the adjustment of thermal expansion are particularly effective especially in the co-sintering process. Among them, by using a material mainly composed of aluminum nitride as the base material of the second structural body, it becomes easier to maintain a high thermal conductivity and to maintain the surface temperature uniformity of the ceramic material with high corrosion resistance. Such construction is especially effective in a system of producing semiconductors of so-called heater embedded type.

The inventive ceramic material may be used for a laminated body having a first structural body utilizing the ceramic material and a second structural body including, as its main phase, at least one of aluminum nitride, yttrium oxide and aluminum oxide. Further, it may have a structure in which the first and second structural bodies are laminated or bonded with each other. By applying the first structural body with high corrosion resistance and the second structural body with the other property (for example heat transmission or mechanical strength), it is thereby possible to further improve the corrosion resistance as well as the other properties. Here, the first structural body may be a thin film, plate body or laminated body formed with the ceramic materials. Further, the second structural body may be composed of a thin film, plate-shaped body or laminated body having aluminum nitride, yttrium oxide and aluminum oxide as its main phase. Besides, the bonding may be made according to any embodiment, and for example may be bonded by sintering or an adhesive agent, for example.

At this time, the first and second structural bodies may be bonded with each other through an intermediate layer. By the intermediate layer, it is thereby possible to further prevent the peeling of the first and second structural bodies due to, for example difference of thermal expansion coefficients. The intermediate layer may be a layer having properties between those of the first and second structural bodies. The intermediate layer may be, for example, a layer of mixing the main phases of the first and second structural bodies. Further, the intermediate layer may include a plurality of layers having different components or ratios of components. It is thereby possible to provide properties of a functionally graded material.

Further, a difference of linear thermal expansion coefficients of the first and second structural bodies may be 0.3 ppm or smaller, and the first and second structural bodies may be directly bonded with each other. Since the difference of the linear thermal expansion coefficients of the first and second structural bodies is made thus small, it is possible to avoid the risk of cracks or peeling, in the case that both structural bodies are bonded with each other at a high temperature (for example bonded by sintering) or the laminated body is repeatedly used at high and low temperatures.

(Production of Ceramic Material)

The inventive ceramic material can be produced by molding powdery mixture of magnesium oxide, alumina and aluminum nitride and then by sintering. For example, for obtaining high corrosion resistance comparable with, or higher than, that of spinel, 15 mass percent or more and 66.2 mass percent or less of magnesium oxide, 63 mass percent or less of alumina and 57.7 mass percent or less of aluminum nitride may be mixed to obtain powdery mixture, which may be molded and then sintered. Further, 37 mass percent or more and 66.2 mass percent or less of magnesium oxide, 63 mass percent or less of alumina and 57.7 mass percent or less of aluminum nitride may be mixed to obtain powdery mixture, which may be molded and then sintered. On the other hand, for lowering the linear thermal expansion coefficient to improve temperature uniformity while maintaining the corrosion resistance comparable with that of spinel, 5 mass percent or more and 60 mass percent or less of magnesium oxide, 60 mass percent or less of alumina and 90 mass percent or less of aluminum nitride may be mixed to obtain powdery mixture, which may be molded and then sintered. Further, the sintering temperature may preferably be 1750° C. or higher. In the case that the sintering temperature is lower than 1750° C., it would be a risk that the targeted magnesium-aluminum oxynitride would not be generated, which is not preferred.

Besides, although the upper limit of the sintering temperature is not particularly limited, it may be 1850° C. or 1900° C., for example. Further, hot press sintering may be preferably applied for the sintering, and a pressure during the hot press sintering may preferably be set in a range of 50 to 300 kgf/cm$^2$. Atmosphere during the sintering may preferably be that which does not affect the sintering of the oxide raw material, and may preferably be an inert atmosphere such as nitrogen, argon, helium atmosphere or the like. The pressure for the molding is not particularly limited and may be adjusted at any pressure as far as it is possible to maintain the shape.

(Electrostatic Chuck)

Figure 5:
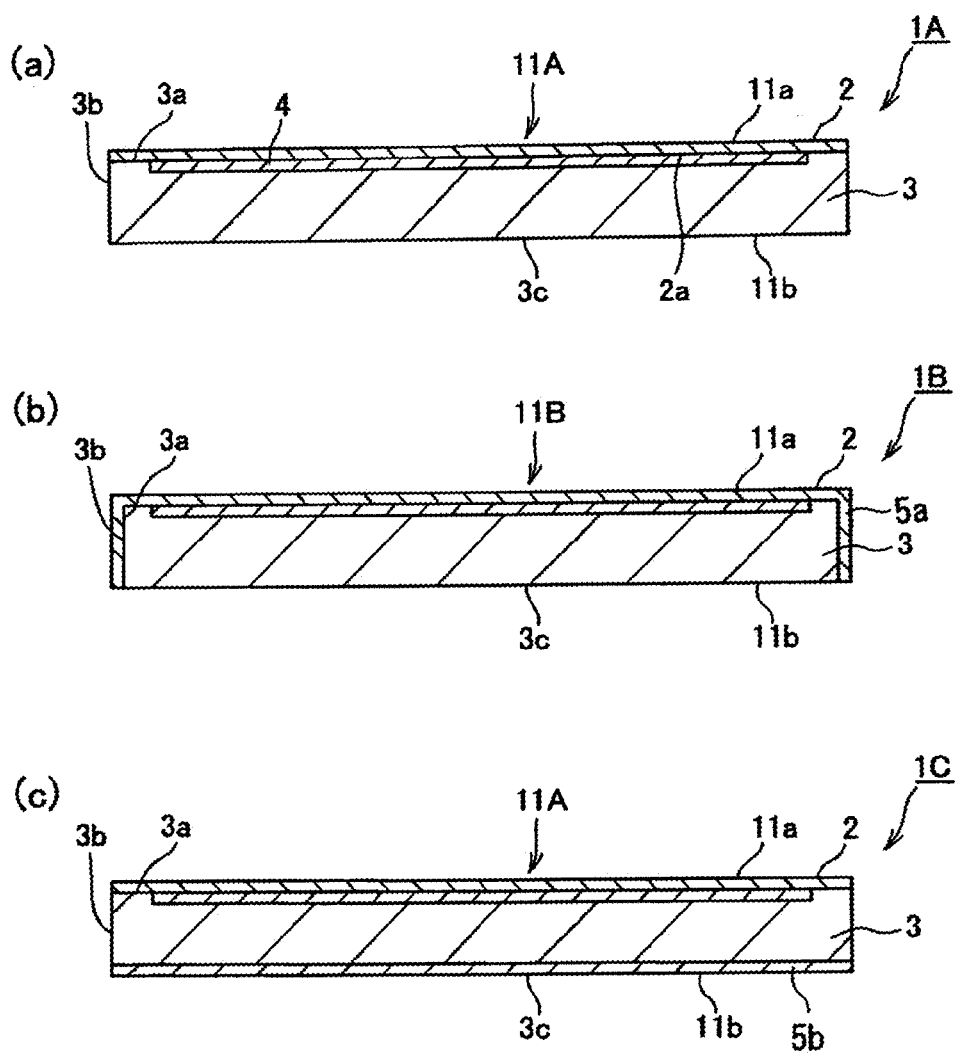
FIGS. 5(*a*), 5(*b*) and 5(*c*) are cross sectional views schematically showing electrostatic chucks 1A, 1B and 1C, respectively, according to embodiments of the present invention.
Figure 6:
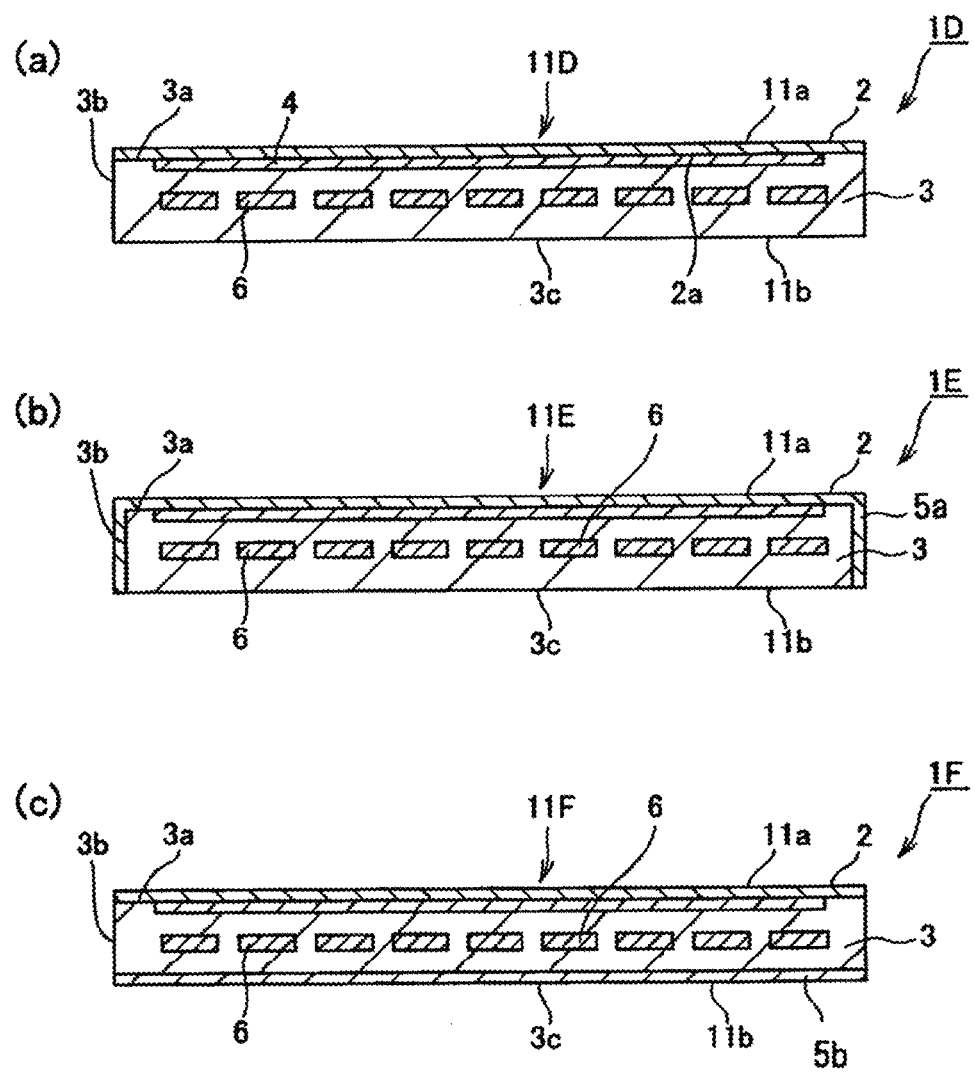
FIGS. 6(*a*), 6(*b*) and 6(*c*) are cross sectional views schematically showing electrostatic chucks 1D, 1E and 1F, respectively, according to embodiments of the present invention.

Electrostatic chucks of the present invention will be described below, appropriately referring to FIGS. 5 to 7.

According to an electrostatic chuck 1A shown in FIG. 5(a), a susceptor 11A is composed of a plate shaped main body 3 and a dielectric layer 2. According to the present example, a back face 3c of the plate shaped main body 3 forms a back face 11b of the susceptor 11A. The dielectric layer 2 is provided on the side of an upper face 3a of the plate shaped main body 3, and an upper face of the dielectric layer 2 forms an adsorption face 11a. According to the present example, an electrostatic chuck electrode 4 is formed on the upper face 2a of the dielectric layer 2 on the side of the plate shaped main body. According to the present example, a side face 3b and back face 3c of the plate shaped main body 3 are not covered with a corrosion resistant layer.

According to the present example, the dielectric layer forms a surface corrosion resistant layer, which is formed of the ceramic material of the present invention.

The adsorption face 11a is not necessarily flat over the whole face, and the adsorption face may be roughened, or it may be formed a groove having a size comparable with that of the substrate or a groove for flowing purge gas.

According to an electrostatic chuck 1B shown in FIG. 5(b), a susceptor 11B is composed of a plate shaped main body 3 and a dielectric layer 2. According to the present example, a back face 3c of the plate shaped main body 3 forms a back face 11b of the susceptor 11B. The dielectric layer 2 is provided on the side of an upper face 3a of the plate shaped main body, and an upper face of the dielectric layer 2 forms an adsorption face 11a. According to the present example, it is further provided a side face corrosion resistant layer 5a covering a side face 3b of the plate shaped main body.

According to the present example, the dielectric layer 2 forms the surface corrosion resistant layer, and formed of the ceramic material of the present invention. The side face corrosion resistant layer 5a was formed of the ceramic material described above. The corrosion of the side face of the susceptor would become a cause of particles as well as the change of thermal radiation characteristics from the side face, which adversely affects the temperature uniformity on wafer. According the present embodiment, it is possible to prevent corrosion on the side of the wafer as well as of the side face.

According to an electrostatic chuck 1C shown in FIG. 5(c), a susceptor 11C is composed of a plate shaped main body 3 and a dielectric layer 2. According to the present example, a back face 3c of the plate shaped main body 3 forms a back face 11b of the susceptor 11C. The dielectric layer 2 is provided on the side of an upper face 3a of the plate shaped main body, and an upper face of the dielectric layer 2 forms an adsorption face 11a. According to the present example, it is further provided a back face covering layer 5b covering a back face 3c of the plate shaped main body. According to the present example, the dielectric layer 2 forms the surface covering layer, and is formed of the ceramic material of the present invention. The back face covering layer 5b is also formed of the ceramic material of the present invention.

In the case that a material having a thermal conductivity higher than that of the ceramic material is used as a material of the plate shaped main body, the temperature uniformity on wafer is improved due to the thermal conduction in the plate shaped main body as a whole. However, in this case, since an amount of heat dissipation from the back face 3c of the plate shaped main body 3 is also increased, there is a possibility that the temperature uniformity on wafer may be deteriorated due to uneven thermal radiation. According to the present embodiment, since the back face covering layer made of the ceramic material is provided on the side of the back face of the plate shaped main body, it is possible not only to realize the corrosion resistance on the side of the back face, but also to reduce the thermal radiation from the back face of the susceptor as a whole, so that the temperature uniformity on wafer can be further improved.

An electrostatic chuck 1D shown in FIG. 6(a) is same as the electrostatic chuck 1A shown in FIG. 5(a), except that a heat resistance 6 is embedded within the plate shaped main body 3 of the susceptor 11D.

An electrostatic chuck 1E shown in FIG. 6(b) is same as the electrostatic chuck 1B shown in FIG. 5(b), except that a heat resistance 6 is embedded within the plate shaped main body 3 of the susceptor 11E.

An electrostatic chuck 1F shown in FIG. 6(c) is same as the electrostatic chuck 1C shown in FIG. 5(c), except that a heat resistance 6 is embedded within the plate shaped main body 3 of the susceptor 11F.

Although the heating member may preferably be embedded within the susceptor, the heating member may be fitted to the susceptor. Alternatively, the heating member may be an outer heating member, such as an infrared ray heating device, fitted at a position distant from the susceptor.

Figure 7:
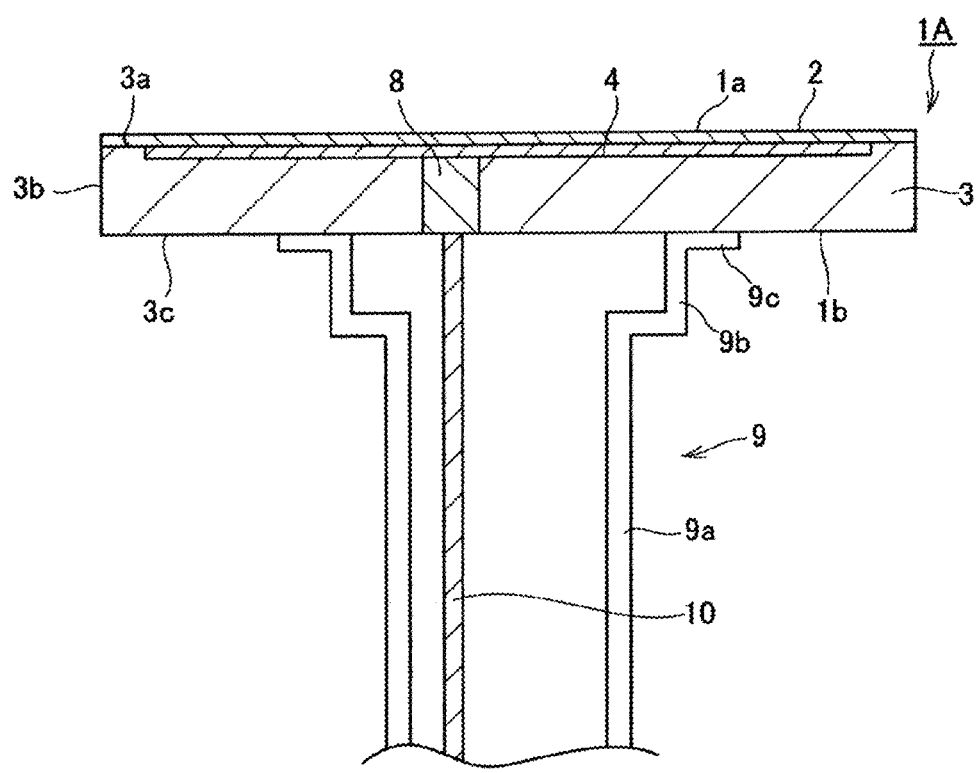
FIG. 7 is a cross sectional view schematically showing an electrostatic chuck 1G according to an embodiment of the present invention.

Further, a supporting part may be provided as shown in FIG. 7. That is, a supporting part 9 is bonded to a lower face (back face) 3c of the susceptor 1A. According to the present example, the supporting part is tube shaped and a member 10 for supplying electricity is contained inside of the supporting part 9. The member for supplying electricity is connected to the electrostatic chuck electrode 4 through an electrical supply terminal 8.

It is preferred that the supporting part includes a step therein, a large size part 9b is provided on the side of the susceptor and a small size part 9a is provided on the opposite side with respect to the step. A flange 9c is formed on an end part of the large size part 9b. Then, the end part of the large size part is bonded to the back face of the susceptor so that the center axis of the supporting part is concentric with that of the susceptor.

The susceptor is plate shaped and preferably, substantially circular disk shaped. Although the size of the susceptor is not particularly limited, the diameter is 280 to 380 mm and thickness is 8 to 20 mm, for example.

Further, in the case that the supporting part is provided, an outer diameter of a bonding part of the susceptor and supporting part is 40 to 120 mm, for example.

According to the above examples, the dielectric layer is composed of one or more surface corrosion resistant layer. However, the dielectric layer may be composed of the surface corrosion resistant layer and one or more intermediate layer, and in this case, it is possible to further improve the adhesive strength of the dielectric layer and plate shaped main body.

It will be described an example of using an electrostatic chuck of the present embodiment. A wafer is mounted on an adsorption face of the electrostatic chuck, and direct current high voltage is applied onto the electrode 4 through the electrical supply terminal of the electrode 4 to generate electrostatic force, so as to adsorb the wafer on the adsorption face. Further, a heater electrical source is connected to the electrical supply terminal of the resistance heater to control the supplied electrical power, so that the temperature of the wafer is controlled at a predetermined temperature. Under this condition, the wafer is subjected to plasma CVD film formation or plasma etching.

(Heating Member and Electrostatic Chuck Electrode)

A wire conductor may be bent and processed to a wounded body, which may be used as the electrostatic chuck electrode or heating member, for example. The wire diameter of the heating member is about 0.3 to 0.5 mm, and the winding diameter in the case of a coil shaped member is about 2 to 4 mm and the pitch is about 1 to 7 mm. The "winding diameter" referred to herein means an inner diameter of the coil.

As the shape of the heating member or electrostatic chuck, in addition to the coil shape, various shapes may be applied such as ribbon, mesh, coil spring, sheet, film, printed electrode or the like. Further, in a part adjoining a through hole formed for supplying purge gas, lift pin or the like, the pattern of the heating member may be optionally changed, for example, the heating member may be turned away from the through hole.

As the material of the heating member or electrostatic chuck, it may be preferably used a conductive material with a high melting point such as molybdenum (Mo), tungsten (w), niobium (Nb), tungsten-molybdenum compound, or the like.

Further, alumina powder may be mixed with a printing paste containing powder of conductive material having a high melting point, such as tungsten, niobium, molybdenum, the alloys thereof, tungsten/molybdenum compound, tungsten carbide or the like, to provide a cermet.

(Material of Plate Shaped Main Body)

According to the inventive ceramic material, the linear thermal expansion coefficient of the magnesium-aluminum oxynitride forming the main phase in a range of 40 to 1000° C. is 6 to 7 ppm/K. Thus, by changing the ratios of the sub-components such as the MgO—AlN solid solution (12 to 14 ppm/K), spinel (8 to 9 ppm/K), and aluminum nitride (5 to 6 ppm/K), the linear thermal expansion coefficient can be controlled in a range of 5.5 to 10 ppm/K while maintaining the high corrosion resistance. However, since spinel or aluminum nitride is lower in the corrosion resistance than the magnesium-aluminum oxynitride or MgO—AlN solid solution, the contents thereof may be preferably smaller. By adjusting the thermal expansion as such, it is possible to match the thermal expansion with those of aluminum oxide, yttrium oxide and aluminum nitride used for members for semiconductor production systems. It is thereby possible to laminate or adhere the inventive ceramic material onto a prior material.

Specifically, the materials of the plate shaped main body include aluminum oxide, yttrium oxide, aluminum nitride, silicon carbide, and may particularly preferably be aluminum oxide, yttrium oxide or aluminum nitride.

In particular, by forming the plate shaped main body with a material including aluminum nitride as its main phase, it is possible to maintain high thermal conductivity and easier to maintain the surface temperature of the corrosion resistant ceramic material uniform.

According to a preferred embodiment, a difference between the thermal expansion coefficient of the plate shaped main body and that of the surface corrosion resistant layer is 0.3 ppm/K or smaller. In this case, when the plate shaped main body and the corrosion resistant layer are bonded with each other at a high temperature (for example bonded by integrated sintering) or when the laminated body is repeatedly used at high and low temperatures, the risk of cracks and peeling can be avoided.

The plate shaped main body and each of the corrosion resistant layer and back face covering layer may be bonded through the intermediate layer. It is thereby possible to further prevent the peeling of the corrosion resistant layer and back face covering layer due to the difference of the thermal expansion coefficients, for example. The intermediate layer is made a layer whose properties are between those of the plate shaped main body and the corrosion resistant layer or back face covering layer.

Specifically, the intermediate layer may be a composite ceramics obtained by sintering mixture of the ceramic material described above and materials for the plate shaped main body.

Further, the intermediate layer may be composed of a plurality of layers and the compositions of the intermediate layers may be made different form each other to form a graded material layer.

(Material of Supporting Part)

A material forming the supporting part 3 (so called shaft) is not particularly limited and includes the followings.

Aluminum nitride, alumina, spinel, magnesium oxide

Preferably, the material of the supporting part 3 is made the ceramic material described above. Even in this case, however, the ceramic materials forming the susceptor and supporting part are not necessarily identical and may be of compositions different from each other in the composition range as described above.

The inventors considered the cause of the deterioration of temperature uniformity when the temperature is deviated from a designed temperature, and speculated that the contribution of radiation thermal conduction becomes predominant among three kinds of thermal conduction patterns at a high temperature. For example, the supporting part is bonded to the central portion of the susceptor, so that solid thermal conduction is predominant at a low temperature and escape of heat from the central portion of the susceptor becomes larger at a low temperature, and the temperature in the central portion is not increased. However, at a high temperature, the contribution of the thermal conduction by radiation becomes relatively large and escape of heat is facilitated in the outer portion without the supporting part than the central portion of the susceptor. The heat dissipation by radiation in the outer portion becomes relatively large, so that the temperature in the outer portion becomes lower than that of the central portion and the temperature uniformity is deteriorated at a high temperature. As a result, by forming the supporting part with the ceramic material as described above, since its thermal conduction is lower than that of aluminum nitride or the like, it is easier to obtain good temperature uniformity over a wide range of operation temperature.

(Production of Electrostatic Chuck)

Although it is not limited a method of producing the electrostatic chuck of the present invention, a preferred production method will be described referring to FIG. 8.

(a) According to the production method described above, mixture of magnesium oxide powder, alumina powder and aluminum nitride powder is sintered to obtain a dense sintered body. That is, the formulated powder described above is subjected to uniaxial pressure molding to produce a plate shaped molded body. The molded body is subjected to hot press sintering to obtain a ceramic sintered body 2A for the dielectric layer.

(b) Then, as shown in FIG. 8(a), one face 2a of the sintered body 2A is polished to form a flat surface. According to the procedure described below, the sintering temperature of producing the sintered body for the plate shaped main body is lower than, or comparable with, that of a sintered body for the dielectric layer. It is thus considered that the surface flatness of the polished surface formed in the step (b) is maintained as it is. Therefore, the surface flatness of the main face 2a forming the electrode in the sintered body finally becomes a parameter considerably contributing to a deviation of thickness, which is defined as a deviation of thickness from the adsorption face of wafer to a flat plate shaped electrode Then, for lowering the deviation of thickness to 100 μm or smaller, the surface flatness of the face 2a polished in the step (b) may preferably be 10 μm or smaller and more preferably be 5 μm or smaller.

(c) Then, as shown in FIG. 8(b), the electrostatic chuck electrode 4 is formed on the polished face 2a of the sintered body 2A.

For example, the electrode and heating resistance can be formed by printing on the surface of the sintered body by screen printing or the like. In this case, it is preferable that alumina powder is added to a printing paste containing powder of a high melting point conductive material such as tungsten, niobium, molybdenum, the alloys thereof and tungsten carbide. It is thereby possible to improve the adhesion between the main body and the electrode or heating resistance. Further, the electrode may be also formed by mounting, on the sintered body, a bulk body (metal mesh) of a conductive material with a high melting point having a shape of a mesh, a bulk body (punching metal) of a conductive material having a high melting point with many holes provided therein, or the like. Further, the heating resistance may be also formed by mounting, on the sintered body, a bulk body of a coil made of a wire of a conductive material having a high melting point, or a bulk body (metal mesh) of a conductive material having a high melting point having a shape of a mesh.

(d) As shown in FIG. 8(c), on the main face 2a where the electrode paste is printed on the sintered body, raw material containing ceramics such as aluminum nitride as its main component is molded to produce a molded body 14 of aluminum nitride. It is then pressurized in a direction of an axis and sintered under inert gas atmosphere such as nitrogen gas or argon gas.

In the case of aluminum nitride, it is preferred that the sintering is performed in 1400 to 2000° C. under inert gas atmosphere such as nitrogen gas or argon gas. In the case that the sintering temperature is lower than 1400° C., its densification becomes difficult. In the case that the sintering temperature exceeds 2000° C., the volume resistivity becomes low. The temperature may more preferably be 1600 to 2000° C., so that it is possible to further stabilize the characteristics of the thus obtained main body. Further, until the maximum temperature, it is preferred that the temperature is elevated at an elevation speed of 200° C./hour or lower. Further, it is preferred to hold at the maximum temperature for 1 to 10 hours. Although the sintering method is not limited, it is preferred to apply hot press sintering, because it can be obtained a dense aluminum nitride sintered body and the volume resistivity of the thus obtained aluminum nitride sintered body can be further improved. In this case, the applied pressure may preferably be 10 to 30 MPa, because it is possible to obtain more dense sintered body for the main body. For example, the molded body is sintered at a pressure of 20 MPa and at the maximum temperature of 1830° C. for 2 hours.

(e) Then, as shown in FIG. 8(d), a main face 12 of the sintered body 2A opposing to the aluminum nitride powder sintered body 3 is polished to form a wafer adsorption face 1a. It is thus possible to obtain a susceptor having a thickness deviation of 100 μm or smaller, which indicates deviation of thickness from the wafer adsorption face to the electrode 4.

That is, since swells are not generated in the electrode 4 at the sintering temperature of the aluminum nitride sintered body, it is possible to maintain the thickness deviation from the wafer adsorption face to the flat plate shaped electrode at a small value. A through hole is formed in the central portion of the back face of the plate shaped main body 3 of the susceptor to the flat plate shaped electrode, and the cylindrical terminal 8 (refer to FIG. 7) is fitted into the through hole, so that a voltage can be applied through the terminal to the flat plate shaped electrode.

(Halogen Based Corrosive Gas)

The inventive susceptor is superior in the corrosion resistance against the halogen based corrosive gas and its plasma, and especially excellent in the corrosion resistance against the following halogen based corrosive gasses, the mixtures and plasmas.

$NF_3$, $CF_4$, $ClF_3$, $Cl_2$, $BCl_3$, HBr

EXAMPLES

Production and Evaluation of Ceramic Material

Preferred applications of the present invention will be described below. As MgO, $Al_2O_3$ and AlN raw materials, they were used commercial products each having a purity of 99.9 mass percent or higher and an average particle size of 1 μm or lower. Here, as about 1 percent of oxygen is inevitable in the AlN raw material, the above described purity is calculated after oxygen content is excluded from the impurity contents. Further, even in the case that it is used MgO material having a purity of 99 mass percent or higher, it could be produced a ceramic material comparable with that produced by using MgO material having a purity of 99.9 mass percent or higher.

1. Ceramic Material

First, it will be described the ceramic material containing magnesium, aluminum, oxygen and nitrogen as the main components (Experiments 1 to 19). Besides, the experiments 1 to 3 and 6 to 16 correspond to inventive examples and experiments 4, 5 and 17 to 19 correspond to comparative examples.

Experiments 1 to 3

Formulation

Raw materials of MgO, $Al_2O_3$ and AlN were weighed according to the mass % shown in table 1, and then wet-mixed using isopropyl alcohol as a solvent, nylon pot and alumina grinding stone with a diameter of 5 mm for 4 hours. After the mixing, slurry was collected and dried in nitrogen flow at 110° C. Thereafter, the dried matter was passed through a sieve of 30 mesh to obtain formulated powder. Besides, the molar ratio of Mg/Al in the formulated powder was 1.2

(Molding)

The formulated powder was subjected to uniaxial press molding at a pressure of 200 kgf/cm² to produce a disk-shaped molded body having a diameter of about 35 mm and a thickness of about 10 mm, which was then contained in a graphite mold for sintering.

(Sintering)

The disk-shaped body was subjected to hot press sintering to obtain the ceramic material. The hot press sintering was performed at a pressure of 200 kgf/cm² and at a sintering temperature (the maximum temperature) shown in table 1, in Ar atmosphere until the completion of the sintering. The holding time at the sintering temperature was made 4 hours.

Experiment 4

The ceramic material was obtained according to the same procedure as the Experiment 1, except that raw materials of MgO and $Al_2O_3$ were weighed according to the mass % shown in table 1.

Experiment 5

The ceramic material was obtained according to the same procedure as the Experiment 1, except that the sintering temperature was set at 1650° C.

Experiments 6 to 12

The ceramic material was obtained according to the same procedure as the Experiment 1, except that raw materials of MgO, $Al_2O_3$ and AlN were weighed according to the mass % shown in table 1 and that the sintering temperature was made that shown in table 1.

Experiments 13 to 19

The ceramic material was obtained according to the same procedure as the Experiment 1, except that raw materials of MgO, $Al_2O_3$ and AlN were weighed according to the mass % shown in table 1, that the sintering temperature was made that shown in table 1, and that the atmosphere during the sintering was made $N_2$.

(Evaluation)

Each of the materials obtained in the experiments 1 to 19 was processed adapted for various evaluation procedures and the following evaluations were performed. The result of each evaluation was shown in table 1. Besides, according to each of the experiments 1 to 19, another sample having a diameter of 50 mm was also produced and it was proved that the samples provided evaluation results similar to those shown in table 1.

(1) Bulk Density, Open Porosity

They were measured according to Archimedean method using pure water as a medium.

(2) Evaluation of Crystal Phase

The material was ground using a mortar and its crystal phase was identified by an X-ray diffraction system. The condition of the measurement was made CuKα, 40 kV, 40 mA, and 2θ=5 to 70° with a sealed tube type X-ray diffraction system ("D8-ADVANCE" supplied by Bruker AXS corporation) used.

(3) Etching Rate

The surface of each of the materials was polished to a mirror face, which was then subjected to corrosion resistance test using an ICP plasma corrosion resistance test system according to the following conditions. The step of a masked face and exposed face was measured by a step gauge and the step value was divided by a test time period to calculate the etching rate of each material.

ICP: 800 W, Bias: 450 W, Introduced gas: NF3/O2/Ar=75/35/100 sccm, 0.05 Torr (6.67 Pa), Exposed time period: 10 hr, Temperature of sample; Room temperature (4) Constituent Atoms The detection, identification and analysis of content of each constituent atom were performed using EPMA.

(5) Average Linear Thermal Expansion Coefficient (40 to 1000° C.)

The measurement was performed using a dilatometer (supplied by Bruker AXS corporation) under argon atmosphere.

(6) Bending Strength

It was measured by bending strength test according to JIS-R1601.

(7) Measurement of Volume Resistivity

It was measured a method according to JIS-C2141 in air at room temperature (25° C.). The shape of a test sample was of a diameter of 50 mm×(0.5 to 1 mm), and a main electrode with a diameter of 20 mm, a guard electrode with an inner diameter of 30 mm and an outer diameter of 40 mm and an applying electrode with a diameter of 40 mm were formed, while the electrodes were made of silver. A voltage of 2 kV was applied and it was read a current value at a time point 1 minute after the application of the voltage, and the current value was used to calculate a volume resistivity at room temperature. Further, as to the Experiments 7 and 19 (MgO sintered body), it was measured in vacuum (0.01 Pa or below) and at 600° C. The shape of a test sample was of a diameter of 50 mm×(0.5 to 1 mm), and a main electrode with a diameter of 20 mm, a guard electrode with an inner diameter of 30 mm and an outer diameter of 40 mm and an applying electrode with a diameter of 40 mm were formed while the electrodes were made of silver. A voltage of 500V/mm was applied and it was read a current value at a time point 1 hour after the application of the voltage, and the current value was used to calculate a volume resistivity. Further, in values of the volume resistivity shown in table 1, "aEb" represents a×$10^b$, and, for example, "1E16" represents 1×$10^{16}$.

(Evaluation Results)

FIG. 1 shows an XRD analytical chart obtained in Experiment 1. Further, XRD analytical charts obtained in Experiments 2 and 3 were proved to be substantially same as that in the Experiment 1, the charts were not shown. Further, table 1 shows crystal phases detected in all of the Experiments 1 to 19. As shown in FIG. 1, the XRD analytical charts of the ceramic materials according to the Experiments 1 to 3 include a plurality of unidentified peaks (□ in FIG. 1) and peaks (○ in FIG. 1) corresponding with the MgO—AlN solid solution composed of magnesium oxide into which aluminum nitride is dissolved. The unidentified peaks "□" include peaks in a range of 2θ=47 to 49° (47 to 50°) which do not correspond with those of magnesia, spinel and aluminum nitride, and it was assumed to be magnesium-aluminum oxynitride. Besides, these peaks of the magnesium-aluminum oxynitride are not identical with those of MgAlON (or MAGALON) shown in reference 1 (J. Am. Ceram. Soc., 93 [2] pages 322 to 325 (2010)) and reference 2 (Japanese Patent Publication No. 2008-115065A). Generally, the MgAlON is known to be spinel with N component dissolved therein, and it is thus considered that its crystal structure is different from that of the inventive magnesium-aluminum oxynitride.

Figure 2:
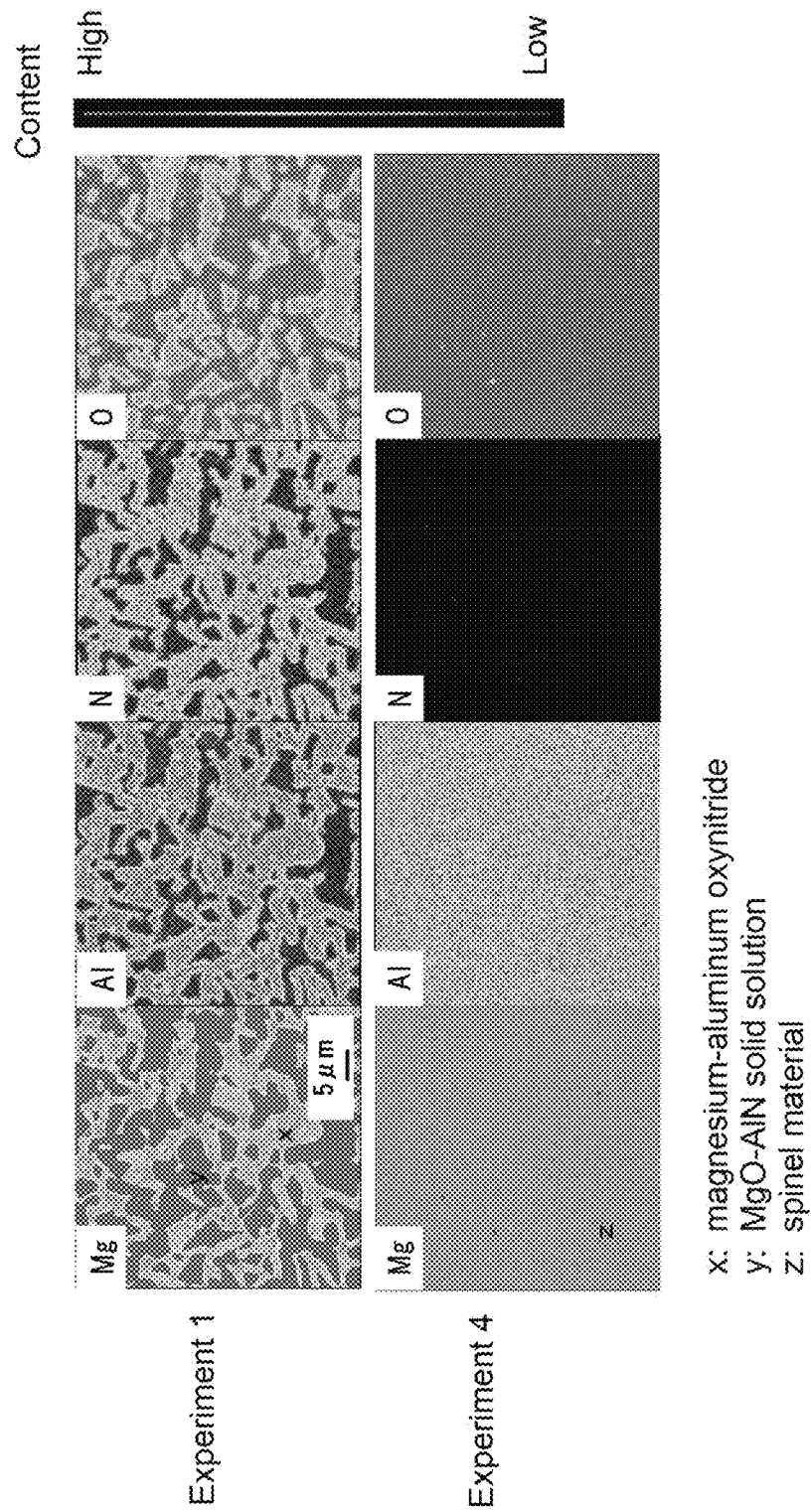
FIG. 2 is EPMA element mapping images obtained in Examples 1 and 4.

The XRD peaks corresponding with (111) face, (200) face and (220) face of the MgO—AlN solid solution were shown in 2θ=36.9 to 39°, 42.9 to 44.8° and 62.3 to 65.2°, respectively, which are between the peaks of cubic phase of magnesium oxide and cubic phase of aluminum nitride. FIG. 2 shows EPMA element mapping images obtained in the Experiment 1. As shown in FIG. 2, it was proved that the material of the Experiment 1 is composed of the two phases of the magnesium-aluminum oxynitride ("x" part) shown in FIG. 1 and the MgO—AlN solid solution ("y" part) and that the former forms the main phase. Here, the main phase means a component occupying 50 percent or more in volume ratio, and sub-phase means a phase other than the main phase and whose XRD phase is identified. A ratio of area at an observed cross section is considered to reflect the volume ratio, so that the main phase is defined as an area having a area ratio of 50 percent or more in an EPMA element mapping image and the sub phase is defined as an area other than the main phase. As shown in FIG. 2, the ratio of area of the magnesium-aluminum oxynitride was about 66 percent and the magnesium-aluminum oxynitride was proved to be the main phase. Besides, "x" part is identified as the magnesium-aluminum oxynitride, because it was composed of four components of Mg, Al, O and N, and the contents of Mg and N were higher than, Al content was close to and O content was lower than those in spinel material ("z" part) obtained in the Experiment 4. That is, the magnesium-aluminum oxynitride is characteristic in containing more Mg than spinel. Similar analysis was performed for the other Experiments and, for example, it was proved that the ratio of area of the magnesium-aluminum oxynitride was about 87 percent to constitute the main phase in the Experiment 10. Further, although the judgment of the main and sub phases was performed by the EPMA element mapping according to the present example, another method may be applied as far as it is possible to distinguish the volume ratio of each phase.

Besides, an EPMA element mapping image is divided into colors of red, orange, yellow, yellowish green, green, blue and indigo blue depending on the contents, so that red, indigo blue and black correspond to the highest content, the lowest content and zero, respectively. However, as FIG. 2 is shown in monochrome, the following description is given for original colors in FIG. 2 below. According to the Experiment 1, "x" and "y" parts were colored in yellowish green and red for Mg, respectively, "x" and "y" parts were colored in orange and blue for Al, respectively, "x" and "y" parts were colored in orange and blue for N, respectively, and "x" and "y" parts were colored in aqua blue and orange for O, respectively. According to the Experiment 4, the whole area ("z" part) was colored in green for Mg, the whole area was colored in orange for Al, the whole area was colored in black for N, and the whole area was colored in red for O.

Figure 3:
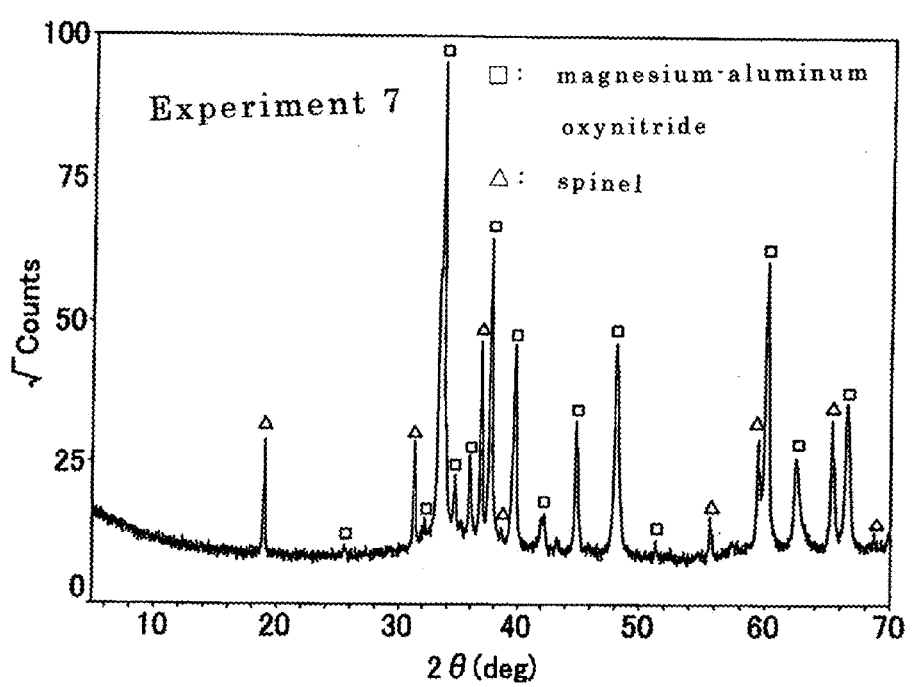
FIG. 3 is an XRD analytical chart obtained in Experiment 7.
Figure 4:
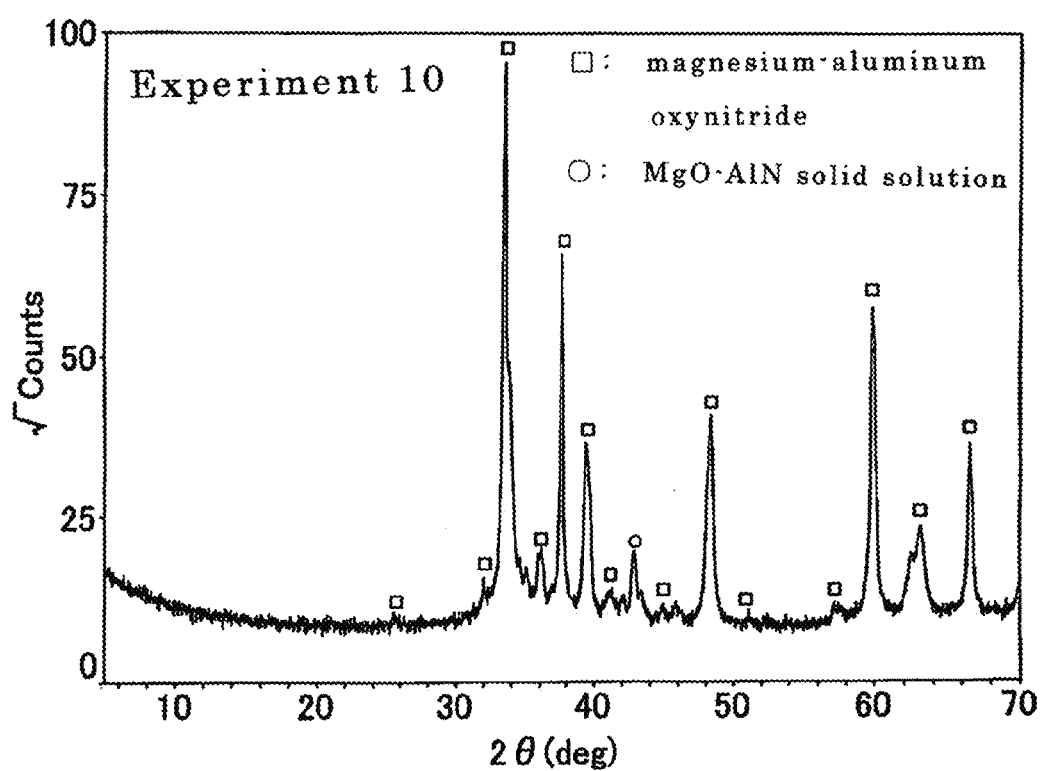
FIG. 4 is an XRD analytical chart obtained in Experiment 10.

Further, according to the Experiment 4, as aluminum nitride was not used, the above described magnesium-aluminum oxynitride was not generated, so that the ceramic material contained, as the main phase, spinel ($MgAl_2O_4$). According to the Experiment 5, as the sintering temperature was low, the above described magnesium-aluminum oxynitride was not generated, so that the ceramic material contained magnesium oxide as the main phase and spinel and aluminum nitride as the sub phases. FIGS. 3 and 4 show XRD analytical charts of the Experiments 7 and 10, respectively. As can be seen from FIGS. 3 and 4, it was mainly detected the magnesium-aluminum oxynitride (□ in the figures) having peaks in a range of 2θ=47 to 49 (or 47 to 50°) in the Experiments 7 and 10, and spinel (Δ in the figure) and MgO—AlN solid solution (○ in the figure) were found as the sub phases in the Experiments 7 and 10, respectively. Besides, the XRD analytical charts were omitted as to the Experiments 6, 8, 9, 11 and 12 and the main and sub phases are shown in table 1.

Then, the etching rates of the ceramic materials of the Experiments 1 to 3 and 6 to 8 were as low as 80 percent or lower, and the etching rates in the Experiments 9 to 12 were as low as 90 percent or lower, of that in the Experiment 4. It was thus proved that the corrosion resistance was very high. As that of the Experiment 5 includes much amounts of spinel and aluminum nitride with lower corrosion resistance, the etching rate was proved to be higher. Besides, the etching rate of alumina shown in the Experiment 18 was higher than that of the ceramic material (spinel) of the Experiment 4. The ceramic materials of the Experiments 1 to 3 and 6 to 8 have sufficiently high bending strengths and volume resistivities.

It was further measured an etching rate at high temperature. Here, for the ceramic materials of the Experiments 2 and 10, the surface of each of the materials was polished to a mirror face and subjected to corrosion resistance test at high temperature under the following conditions using an ICP plasma corrosion resistance test system. Then, a step between the masked face and exposed face measured by a step gauge is divided by a test time period to calculate the etching rate of each material. As a result, the etching rate of each material was 1/3 or lower of that of alumina, 1/5 or lower of that of aluminum nitride, and comparable with that of spinel, and the corrosion resistance against plasma at high temperature was also good.

ICP: 800 W, Bias: none, Introduced gas: NF$_3$/Ar=300/300 sccm, 0.1 Torr, Exposed time: 5 h, Temperature of sample: 650° C.

According to the ceramic materials of the Experiments 12 to 16, the etching rate (212 to 270 nm/h) was very close to that of spinel of the Experiment 4, and the linear thermal expansion coefficient (5.8 to 6.9 ppm/K) was lower than that of spinel. That is, the ceramic materials of the Experiments 12 to 16 were proved to have corrosion resistance comparable with that of spinel while providing a lower linear thermal expansion coefficient, so that they are useful for materials of an electrostatic chuck and heater, especially heater. Besides, although raw material composition of the Experiment 17 was made identical with that of the Experiment 6, the sintering temperature was made lower. Consequently, its main phase was not the magnesium-aluminum oxynitride but spinel, so that its corrosion resistance was lowered and linear thermal expansion coefficient was higher compared with those of the Experiment 6. Further, the ceramic materials of the Experiments 12 to 16 have sufficiently high bending strength and volume resistivity.

Further, the volume resistivities at 600° C. in the Experiments 7 and 19 were $5\times10^8$ Ω·cm and $2\times10^{12}$ Ω·cm, respectively. It was proved that the ceramic material having, as the main phase, the magnesium-aluminum oxynitride phase having an XRD peak at least in a range of 2θ=47 to 49° (or 47 to 50°) has an electrical resistance lower than that of MgO.

As described above, it is predicted that the ceramic materials produced in the Experiments 1 to 3 and 6 to 16 also have electrical resistances lower than that of magnesium oxide.

TABLE 1

| | Relationship With invention | First Component (MgO) (mass %) | Second Component (Al2O3) (mass %) | Third component (AlN) (mass %) | Mg/Al molar ratio | Sintering Temperature (° C.) | Bulk Density g/cm2 | Open porosity (%) |
|---|---|---|---|---|---|---|---|---|
| Exp. 1 | Inventive | 51.6 | 21.9 | 26.5 | 1.2 | 1850 | 3.40 | 0.04 |
| Exp. 2 | Example | 51.6 | 21.9 | 26.5 | 1.2 | 1800 | 3.37 | 0.03 |
| Exp. 3 | | 51.6 | 21.9 | 26.5 | 1.2 | 1750 | 3.38 | 0.03 |
| Exp. 4 | Comparative | 28.2 | 71.8 | — | 0.5 | 1850 | 3.57 | 0.01 |
| Exp. 5 | Example | 51.6 | 21.9 | 26.5 | 1.2 | 1650 | 3.47 | 0.01 |
| Exp. 6 | Inventive | 33.3 | 30.2 | 36.4 | 0.7 | 1775 | 3.28 | 0.02 |
| Exp. 7 | Example | 27.6 | 32.8 | 39.6 | 0.4 | 1800 | 3.30 | 0.02 |
| Exp. 8 | | 33.9 | 22.3 | 43.8 | 0.6 | 1800 | 3.28 | 0.01 |
| Exp. 9 | | 28.1 | 24.3 | 47.7 | 0.4 | 1850 | 3.25 | 0.02 |
| Exp. 10 | | 28.1 | 24.3 | 47.7 | 0.4 | 1800 | 3.26 | 0.02 |
| Exp. 11 | | 28.1 | 24.3 | 47.7 | 0.4 | 1750 | 3.26 | 0.03 |
| Exp. 12 | | 18.6 | 27.5 | 54.0 | 0.3 | 1800 | 3.33 | 0.02 |
| Exp. 13 | | 9.6 | 11.0 | 79.4 | 0.1 | 1800 | 3.27 | 0.01 |
| Exp. 14 | | 9.6 | 11.0 | 79.4 | 0.1 | 1850 | 3.27 | 0.08 |
| Exp. 15 | | 24.2 | 25.5 | 50.2 | 0.4 | 1800 | 3.27 | 0.12 |
| Exp. 16 | | 9.4 | 19.4 | 71.2 | 0.1 | 1900 | 3.27 | 0.02 |
| Exp. 17 | Comparative | 33.3 | 30.2 | 36.4 | 0.7 | 1700 | 3.28 | 0.03 |
| Exp. 18 | Example | 0 | 100 | 0 | — | 1700 | 3.94 | 0.01 |
| Exp. 19 | | 100 | 0 | 0 | — | 1500 | 3.57 | 0.30 |

| | Crystal phase | | NF$_3$ Etching Rate (nm/h) | Linear thermal expansion coefficient @40~1000° C. (ppm/K) | Strength (MPa) | Volume Resistivity @25° C.(Ω·cm) | Volume Resistivity @600° C. (Ω·cm) |
|---|---|---|---|---|---|---|---|
| | Main phase | Sub phase | | | | | |
| Exp. 1 | Mg—Al—O—N* | MgO—AlNss** | 176 | 9.5 | 240 | >1E16 | — |
| Exp. 2 | Mg—Al—O—N* | MgO—AlNss** | 177 | 9.3 | 291 | >1E16 | — |
| Exp. 3 | Mg—Al—O—N* | MgO—AlNss** | 179 | 9.6 | 320 | >1E16 | — |
| Exp. 4 | MgAl$_2$O$_4$ | None | 244 | 8.6 | 168 | >1E16 | — |
| Exp. 5 | MgO | MgAl$_2$O$_4$, AlN | 224 | >10 | 350 | >1E16 | — |
| Exp. 6 | Mg—Al—O—N* | MgO—AlNss** MgAl$_2$O$_4$ | 181 | 7.7 | 236 | >1E16 | — |
| Exp. 7 | Mg—Al—O—N* | MgAl$_2$O$_4$ | 191 | 7.3 | 242 | >1E16 | 5E8 |
| Exp. 8 | Mg—Al—O—N* | MgO—AlNss** | 195 | 7.6 | 272 | >1E16 | — |
| Exp. 9 | Mg—Al—O—N* | MgO—AlNss** | 210 | 7.1 | 233 | >1E16 | — |
| Exp. 10 | Mg—Al—O—N* | MgO—AlNss** | 209 | 7.1 | 257 | >1E16 | — |
| Exp. 11 | Mg—Al—O—N* | MgO—AlNss** | 211 | 7.1 | 265 | >1E16 | — |
| Exp. 12 | Mg—Al—O—N* | AlN, MgAl$_2$O$_4$ | 219 | 6.9 | 387 | >1E16 | — |
| Exp. 13 | Mg—Al—O—N* | AlN, MgAl$_2$O$_4$ | 270 | 5.8 | 304 | >1E16 | — |
| Exp. 14 | Mg—Al—O—N* | AlN MgAl$_2$O$_4$ | 255 | 6.0 | 304 | >1E16 | — |
| Exp. 15 | Mg—Al—O—N* | MgAl$_2$O$_4$ | 212 | 6.9 | 283 | >1E16 | — |
| Exp. 16 | Mg—Al—O—N* | AlN, MgAl$_2$O$_4$ | 230 | 6.2 | 320 | >1E16 | — |
| Exp. 17 | MgAl$_2$O$_4$ | AlN, MgO | 256 | 8.1 | 400 | — | — |

TABLE 1-continued

| Exp. 18 | Al$_2$O$_3$ | None | 623 | 8.0 | 290 | — | — |
| Exp. 19 | MgO | — | — | — | 240 | >1E16 | 2E12 |

*Mg—Al—O—N: Magnesium-aluminum oxynitride (XRD: peaks in 2θ = 47-49°)
**MgO—AlNss: MgO—AlN solid solution
[—]: not measured 2. Laminated Sintering Next, it will be described a laminated body provided by laminated sintering of first and second structural bodies utilizing the ceramic material described above (Experiments 20 to 26). Besides, the Experiments 20 to 24 correspond to the inventive examples and the Experiments 25 and 26 correspond to comparative examples.

Experiments 20 and 21

The ceramic materials of the Experiments 4 and 6 to 12 have average linear thermal expansion coefficients of 7 to 9 ppm/K in 40 to 1000° C. According to the Experiments 20 and 21, as shown table 2, the first structural body was made of the ceramic material of the Experiment 10, and the second structural body was made of aluminum nitride. The first and second structural bodies were laminated and molded to a provide a sample having a diameter of 50 mm, which was subjected to laminated sintering. As the aluminum nitride, it was used aluminum nitride to which 5 mass percent of yttrium oxide was added as a sintering aid in outer addition (that is, 5 mass parts of Y$_2$O$_3$ was added to 100 mass parts of AlN, referred to as AlN [1]), or aluminum nitride to which 50 mass percent of yttrium oxide was added (That is, 50 mass parts of Y$_2$O$_3$ was added to 100 mass parts of AlN, referred to as AlN [2]). As raw materials of aluminum nitride and yttrium oxide, it was used commercial products having a purity of 99.9 mass percent or higher and an average particle size of 1 μm or smaller. Here, as AlN material inevitably contains about 1 mass percent of oxygen, the purity was calculated after oxygen is removed from impurity elements. Further, since the average linear thermal expansion coefficient in 40 to 1000° C. was 5.7 ppm/K in AlN [1] and 6.2 ppm/K in AlN[2], it is provided a difference of thermal expansion between the first and second structural bodies. Therefore, between the first and second structural bodies, it was provided an intermediate layer in which the raw materials of AlN[1] or AlN[2] and raw materials of the Experiment 10 were mixed. The difference of thermal expansion can be relaxed by the intermediate layer. In the Experiment 20 using AlN[1], the intermediate layer was composed of three layers having mass ratios of 25:75, 50:50 and 75:25, respectively, and in the Experiment 21 using AlN [2], the intermediate layer was composed of two layers having mass ratios or 40:60 and 6040, respectively. It will be described steps of formulation, molding and sintering below in detail.

(Formulation)

As the raw material of the first structural body, it was used formulated powder produced according to the similar procedure as the Experiment 10 described above. The raw material of the second structural body was produced as described below with aluminum nitride as the main phase. In AlN [1] of the second structural body, first, aluminum nitride powder and yttrium oxide powder were weighed in a ratio of 100 mass percent and 5.0 mass percent, and then wet-mixed using isopropyl alcohol as a solvent, a nylon pot and nylon agitating media for 4 hours. After the mixing, slurry was collected and dried in nitrogen flow at 110° C. Thereafter, it was passed through a sieve of 30 mesh to produce formulated powder. Further, the thus obtained formulated powder was thermally treated at 450° C. for 5 hours or longer in air atmosphere to fire and remove carbon contents included during the wet mixing. The intermediate layer of the laminated body using AlN[1] was formulated as follows. First, the formulated powders of the Experiment 10 and aluminum nitride described above were weighed in mass ratios of 75:25 (intermediate layer 1), 50:50 (intermediate layer 2), and 25:75 (intermediate layer 3), and then wet-mixed using isopropyl alcohol as a solvent, a nylon pot and nylon agitating media for 4 hours. After the mixing, the slurry was collected and then dried in nitrogen flow at 110° C. Thereafter, it was passed through a sieve of 30 mesh to provide formulated powder. AlN[2] of the second structural body was produced according to the same procedure as AlN[1], except that the aluminum nitride powder and yttrium powder were mixed in a ratio of 100 mass percent and 50 mass percent, respectively. Further, the intermediate layer of the laminated body using AlN[2] was formulated according to the same procedure as AlN[1], except that the formulated powder of the Experiment 10 and that of the aluminum nitride described above were mixed in mass ratios of 60:40 (intermediate layer 1) and 40:60 (intermediate layer 2), respectively.

(Molding)

First, the aluminum nitride formulated powder as the raw material of the second structural body was filled in a metal mold having a diameter of 50 mm, and molded by uniaxial pressure molding at a pressure of 200 kgf/cm$^2$. The aluminum nitride molded body was not drawn out of the mold, and formulated powders of the intermediate layers were filled thereon in the descending order of aluminum nitride contents, while a pressure of 200 kgf/cm$^2$ was applied after each of the filling procedure by uniaxial pressure molding. Lastly, the formulated powder of the Experiment 10 as the raw material of the first structural body was filled and then pressure molded at a pressure of 200 kgf/cm$^2$. As to the laminated body using AlN[1], it was prepared a disk-shaped molded body having a total thickness of 23 mm and including an aluminum nitride layer of 10 mm as the second structural body, three intermediate layers each having a thickness of 1 mm and the layer of the Experiment 10 as the first structural body of 10 mm. Further, as to the laminated body using AlN[2], it was prepared a disk-shaped molded body having a total thickness of 22 mm and including an aluminum nitride layer of 10 mm as the second structural body, two intermediate layers each having a thickness of 1 mm and the layer of the Experiment 10 as the first structural body. These laminated and disk-shaped bodies were contained in a graphite mold for sintering.

(Sintering)

The disk-shaped molded body contained in the graphite mold for sintering was subjected to hot press sintering to obtain a ceramic material by integrated sintering. The hot press sintering was performed at a pressure of 200 kgf/cm$^2$, a sintering temperature of 1800° C., and in Ar atmosphere until the completion of the sintering. The holding time period at the sintering temperature was made 4 hours. Besides, as to the Experiments 20 and 21, the sintering was also performed at a sintering temperature of 1750° C. (Experiments 20-1 and 21-1).

According to the sintered body obtained in the production method described above, in both of the laminated bodies using AlN[1] (Experiments 20, 20-1) and using AlN[2] (experiments 21 and 21-1), the upper part of the sintered body was composed of the magnesium-aluminum oxynitride with high corrosion resistance, the lower part was composed of a sintered body mainly composed of aluminum nitride with high thermal conductivity and an intermediate layer was provided between them. In the intermediate layer, the Al content was inclined so that the Al content is made higher from the first structural body toward the second structural body. Cracks, fractures or the like were not observed at interfaces of the layers of the sintered bodies. It is considered that thermal stress during the sintering could be avoided by providing the intermediate layer between the first and second structural bodies. Further, by controlling the thermal expansion coefficient of aluminum nitride as the base material, it is possible to reduce thermal stress generated between the base material and the magnesium aluminum oxynitride and thereby to reduce the thickness of the intermediate layer. It is considered that such sintered body may be preferably applied for a member used for a system of producing semiconductors, such as an electrostatic chuck, susceptor, heater, plate, inner liner material, observing window, windows for supplying microwave, antenna for connecting microwave or the like, for example.

Experiments 22 to 24

According to the Experiment 22, as shown in table 2, a laminated body was obtained according to the same procedure as the Experiment 20, except that the first structural body was made of the ceramic material of the Experiment 6, the second structural body was made of aluminum nitride and the laminated sintering was performed without the intermediate layer in $N_2$ atmosphere. According to the Experiment 23, as shown in table 2, a laminated body was obtained according to the same procedure as the Experiment 20, except that the first structural body was made of the ceramic material of the Experiment 6, the second structural body was made of yttrium oxide and the laminated sintering was performed without the intermediate layer in $N_2$ atmosphere. According to the Experiment 24, as shown in table 2, a laminated body was obtained according to the same procedure as the Experiment 20, except that the first structural body was made of the ceramic material of the Experiment 13, the second structural body was made of aluminum nitride AlN[1] and the laminated sintering was performed without the intermediate layer in $N_2$ atmosphere. In all of the Experiments 22 to 24, cracks and fractures were not found at the interfaces between the layers. Further, according to each of the Experiments 22 to 24, the difference of the linear thermal expansion coefficients of the first and second structural bodies was as low as 0.3 ppm/K or lower, so that it was possible to prevent the generation of cracks and fractures without providing the intermediate layer. It is considered that, similarly as the Experiments 20 and 21, such laminated body may be preferably applied for a member used for a system of producing semiconductors, such as an electrostatic chuck, susceptor, heater, plate, inner liner material, observing window, window for supplying microwave, antenna for connecting microwave or the like. Besides, according to the Experiments 22 to 24, it may be provided the intermediate layer as the Experiments 20, 20-1, 21 and 21-1.

Experiments 25, 26

According to the Experiment 25, as shown in table 2, a laminated body was obtained according to the same procedure as the Experiment 20, except that the first structural body was composed of alumina, the second structural body was composed of aluminum nitride (AlN[1]), and the laminated sintering was performed in $N_2$ atmosphere. According to the Experiment 26, as shown in table 2, a laminated body was obtained according to the same procedure as the Experiment 20, except that the first structural body was composed of spinel, the second structural body was composed of aluminum nitride (AlN[1]), and the laminated sintering was performed in $N_2$ atmosphere. According to each of the Experiments 25 and 26, cracks were generated at the interface between the layers. This is because the difference between the thermal expansion coefficients of the first and second structural bodies is too large so that it could not prevent the crack formation due to the difference of thermal expansion in spite of providing the intermediate layer.

TABLE 2

| | | First structural body | | | Second structural body | | Intermediate layer | | | |
|---|---|---|---|---|---|---|---|---|---|---|
| | Relationship with invention | Material | Linear thermal expansion coefficient @40~1000° C. (ppm/K) | Material | Linear thermal expansion coefficient @40~1000° C. (ppm/K) | Presence Or Absence | Structure | Sintering tem. ° C. | Presence or absence of cracks |
| Exp. 20 | Inventive | Exp. 10 | 7.1 | AlN (AlN[1]) | 5.7 | Present | Three layers(first and second structural bodies in layers(mass ratio) = 75/25, 50/50, 25/75) | 1800 | Present |
| Exp. 20-1 | | Exp. 10 | 7.1 | AlN (AlN[1]) | 5.7 | Present | Three layers(first and second structural bodies in layers(mass ratio) = 75/25, 50/50, 25/75) | 1750 | Absent |
| Exp. 21 | | Exp. 10 | 7.1 | AlN (AlN[2]) | 6.2 | Present | Two layers(first and second structural bodies in layers(mass ratio) = 60/40, 40/60) | 1800 | Absent |

TABLE 2-continued

| | | First structural body | | Second structural body | | Intermediate layer | | | |
|---|---|---|---|---|---|---|---|---|---|
| | Relationship with invention | Material | Linear thermal expansion coefficient @40~1000° C. (ppm/K) | Material | Linear thermal expansion coefficient @40~1000° C. (ppm/K) | Presence Or Absence | Structure | Sintering tem. ° C. | Presence or absence of cracks |
| Exp. 21-1 | | Exp. 10 | 7.1 | AlN (AlN[2]) | 6.2 | Present | Three layers(first and second structural bodies in layers(mass ratio) = 75/25, 50/50, 25/75) | 1750 | Absent |
| Exp. 22 | | Exp. 6 | 7.7 | Al$_2$O$_3$ | 8.0 | Absent | — | 1800 | Absent |
| Exp. 23 | | Exp. 6 | 7.7 | Y$_2$O$_3$ | 7.9 | Absent | — | 1800 | Absent |
| Exp. 24 | | Exp. 13 | 5.8 | AlN (AlN[1]) | 5.7 | Absent | — | 1800 | Absent |
| Exp. 25 | Comparative | Alumina | 8.0 | AlN (AlN[1]) | 5.7 | Present | Three layers(first and second structural bodies in layers(mass ratio) = 75/25, 50/50, 25/75) | 1800 | Present |
| Exp. 26 | | Spinel | 8.6 | AlN (AlN[1]) | 5.7 | Present | Three layers(first and second structural bodies in layers(mass ratio) = 75/25, 50/50, 25/75) | 1800 | Present |

(Production and Evaluation of Electrostatic Chuck)

The electrostatic chuck of the type shown in FIG. 5(a) was produced according to the procedure described referring to FIG. 8. It was, however, specifically performed as follows.

(a) Raw materials of MgO, Al$_2$O$_3$ and AlN were weighed according to mass % shown in the experiments 1, 8 and 12 shown in table 1, and wet-mixed using isopropyl alcohol as a solvent, a nylon pot, and alumina agitating media with a diameter of 5 mm for 4 hours. After the mixing, the slurry was collected and dried in nitrogen flow at 110° C. It was then passed through a sieve of 30 mesh to produce formulated powder. Then, the formulated powder was subjected to uniaxial press molding at a pressure of 200 kgf/cm$^2$ to obtain a disk shaped molded body. The molded body was then subjected to hot press sintering to obtain a ceramic sintered body 2A. The hot press sintering was performed at a pressure of 200 kgf/cm$^2$ and at each temperature shown in table 1 under Ar atmosphere until the completion of the sintering. The holding time at the sintering temperature was made 4 hours. Commercial product having an average particle size of 1 μm or smaller was used in the step (a).

(b) The main face 2a of the sintered body 2a is polished so that the surface flatness reaches 10 μm.

(c) Tungsten carbide powder and alumina powder are mixed and terpineol is added to prepare paste. The paste is printed on the polished face 1a.

(d) On the main face 2a of the sintered body 2A, aluminum nitride powder (purity of 99.5 percent) containing 5 weight percent of yttria was molded to prepare an aluminum nitride molded body 14. It was sintered at 1830° C. under inert gas atmosphere such as nitrogen gas or argon gas while it is uniaxially pressurized. Further, the temperature is elevated until the maximum temperature at an elevation speed of 100° C./hour and held at the maximum temperature for 2 hours. The pressure is made 20 MPa.

(e) The main face 12 of the sintered body 2A is polished to form an adsorption face 1a to obtain a susceptor having a thickness deviation of 100 μm or smaller. A through hole is formed in the central portion of the back face of the plate shaped main body 3 of the thus obtained susceptor to the electrode 4, and a cylindrical terminal 8 is fitted into the through hole, so that a voltage can be applied on the electrodes 4 through the terminal.

Besides, materials forming the dielectric layers (surface corrosion resistant layers) in the experiment Nos. 1, 2 and 3 shown in table 3 are those used in the experiments Nos. 1, 8 and 12, respectively, in the above examples (table 1).

Experiment No. 4

As experiment No. 4, an electrostatic chuck was produced similarly as the experiment Nos. 1 to 3, except that the dielectric layer 2 described above was formed by sintering aluminum nitride powder (purity of 99.5 percent) with 5 weight percent of yttrium oxide added.

(Test Condition)

Corrosion Resistance Test:

ICP: 800 W, Bias: 450 W, Supplied gas: NF3/O2/Ar=75/35/100 sccm, 0.05 Torr, Exposed time period: 100 hours, Temperature of sample 500° C.

Evaluated Properties:

Temperature uniformity on a wafer, adsorption force and surface roughness before and after the corrosion resistance test described above.

Measurement of Temperature Uniformity:

An Si wafer was mounted on a mounting face of the electrostatic chuck and a direct current voltage of ±500V was applied onto the electrostatic chuck electrode to adsorb the Si wafer. The vacuum degree in the chamber was set at 1E-4 Torr and the power was applied onto the heating resistance to heat to an evaluation temperature of 400° C. at a temperature elevation speed of 10° C./min. After it was confirmed that the input power became constant, the temperature was confirmed by an IR camera (supplied by Nippon Densi: 6100, 21 pts). A difference ΔT between the maximum and minimum values of the temperature on the wafer was defined as temperature uniformity (unit: ° C.). As the temperature uniformity ΔT is smaller, the temperature uniformity is better, enabling more uniform etching in etching treatment of the wafer, for example.

Adsorption Force:

An Si probe (5 cm$^2$) was set on the product and direct current voltage of ±500V was applied onto the electrostatic chuck electrode in vacuum state (1E-4 Torr) to adsorb the Si probe. After 1 minute, the probe was removed to measure a force required for the removal. The measurement was performed at four points in a plane; (−40, 40), (−40, −40), (40, −40) and (40, 40). At this time, the center of a circle passing optional three points on the outer profile of the product was made (0, 0).

Surface Roughness:

The roughness of the product surface was measured by Tailor-Hobson roughness measuring instrument. The measurement was performed at two optional positions in inside and outside parts of the plane.

TABLE 3

| Ex. No. | Material of Dielectric layer | Temperature Uniformity on wafer (° C.) | | | Adsorption force (kPa) | | | Surface roghness (μm) | | |
|---|---|---|---|---|---|---|---|---|---|---|
| | | Before corrosion resistance test | After 50 RF hours | After 100 RF hours | Before corrosion resistance test | After 50 RF hours | After 100 RF hours | Before corrosion resistance test | After 50 RF hours | After 100 RF hours |
| 1 | Experiment 1 | 3.2 | 3.2 | 3.3 | 15 | 15 | 14 | 0.5 | 0.5 | 0.6 |
| 2 | Experiment 2 | 3 | 3.3 | 3.6 | 15 | 14 | 13 | 0.6 | 0.7 | 0.8 |
| 3 | Experiment 12 | 2.8 | 3.1 | 3.4 | 16 | 15 | 13 | 0.7 | 0.8 | 1.0 |
| 4 | Comparative Example 1 | 2.5 | 4.8 | 7.8 | 17 | 14 | 12 | 0.7 | 0.9 | 1.3 |

According to the Experiment Nos. 1, 2 and 3, the temperature uniformity on wafer before the corrosion resistance test was relatively good, and deterioration of the temperature uniformity on wafer after the corrosion resistance test was very small and reduction of the adsorption force was very low.

According to the Experiment No. 4, although the initial temperature uniformity on wafer was very good, the temperature uniformity on wafer and adsorption force after the corrosion resistance test were considerably deteriorated.

These actions and effects are epoch-making in the field of semiconductor treating system, and it can be understood that various applications are expected in the industries.

(Production of Electrostatic Chuck with Supporting Part 9)

After the electrostatic chuck was produced according to (a) to (e) as described above, the supporting part (shaft) 9 was fitted to the back face.

(f) Mixture of aluminum nitride powder and 0.5 weight percent of yttria powder added was molded using a metal mold by cold isostatic press molding (CIP molding) into a shape of a cylindrical shaft, which was sintered at an ambient pressure in nitrogen and subjected to grinding to obtain a cylindrical shaft. The cylindrical shaft was then bonded to the central portion of the ceramic plate at the face to which the electrode was exposed. In the bonding, the flatness of the surface to be bonded is made 10 μm or lower. Then, a bonding agent was uniformly applied on the bonding face of the shaft so that an amount of the bonding agent was made 14 g/cm$^2$. The bonding faces of the ceramic plate and cylindrical shaft were bonded with each other and held in nitrogen gas atmosphere at a bonding temperature of 1450° C. for 2 hours. The temperature elevation speed was made 3.3° C. minute and nitrogen gas (N$_2$, 1.5 atom) was introduced from the time point when the temperature reached 1200° C. Further, the aluminum nitride sintered bodies were pressed with each other in a direction perpendicular to the bonding faces. The pressurization was performed at a pressure of 4 MPa, started from the time point of 1200° C., continued during they were held at the bonding temperature of 1450° C. and finished at the time point where they were cooled at 700° C. The bonding agent was prepared by mixing calcium carbonate and alumina powders in a small amount of water to a paste in a composition of 54 weight percent of CaO and 46 weight percent of Al$_2$O$_3$. Besides, the bonding part had a diameter of 72 mm. The ceramic plate and cylinder shaft were bonded with each other, and an electrical supply rod of nickel was then bonded to the connection terminal in the electrode exposed part of the ceramic plate by soldering using gold solder through COVAL metal.

Although specific embodiments of the present invention have been described above, the invention is not to be limited to these specific embodiments and can be performed with various changes and modifications, without departing from claims.

The invention claimed is:

1. An electrostatic chuck comprising a susceptor and an electrostatic chuck electrode embedded within said susceptor, said susceptor comprising an adsorption face of adsorbing a semiconductor:
    wherein said susceptor comprises a plate shaped main body and a surface corrosion resistant layer, said surface corrosion resistant layer comprising an upper face providing said adsorption face;
    wherein said surface corrosion resistant layer comprises a ceramic material comprising magnesium, aluminum, oxygen and nitrogen as main components; and
    wherein said ceramic material comprises (i) a main phase comprising magnesium-aluminum oxynitride phase exhibiting an XRD peak at least in 2θ=47 to 50° taken by using CuKα ray, and (ii) a sub phase comprising a crystal phase of MgO—AlN solid solution wherein aluminum nitride is dissolved into magnesium oxide, wherein said MgO—AlN solid solution has XRD peaks at (200) and (220) faces taken by using, CuKα ray in ranges of 2ω=42.9 to 44.8° and 62.3 to 65.2°, respectively, which are between peaks of cubic phase of magnesium oxide and cubic phase of aluminum nitride, respectively.

2. The electrostatic chuck of claim 1, wherein a radio frequency voltage can be applied onto said electrostatic chuck electrode.

3. The electrostatic chuck of claim 1, wherein said electrostatic chuck electrode is provided on a main face of said surface corrosion resistant layer on the side of said plate shaped main body.

4. The electrostatic chuck of claim 1, further comprising a heating member embedded within said plate shaped main body.

5. The electrostatic chuck of claim 1, further comprising a supporting part bonded to a back face of said susceptor.

6. The electrostatic chuck of claim 5, wherein said supporting part comprises said ceramic material.

7. The electrostatic chuck of claim 5, further comprising an electrical supplying member contained in an inner space of said supporting part and electrically connected to say electrostatic chuck electrode.

8. The electrostatic chuck of claim 1, wherein said 2θ is 47 to 49°.

9. The electrostatic chuck of claim 1, wherein said MgO—AlN solid solution has an XRD peak at (111) face taken by using CuKα ray in a range of 2θ=36.9 to 39°, which is between peaks of cubic phase of magnesium oxide and cubic phase of aluminum nitride.

10. The electrostatic chuck of claim 1, wherein said ceramic material does not contain AlN crystal phase.

11. The electrostatic chuck of claim 1, wherein said plate shaped main body comprises a ceramics comprising aluminum nitride, yttrium oxide or aluminum oxide as a main phase.

* * * * *

UNITED STATES PATENT AND TRADEMARK OFFICE
CERTIFICATE OF CORRECTION

| | | |
|---|---|---|
| PATENT NO. | : 9,202,718 B2 | Page 1 of 1 |
| APPLICATION NO. | : 13/864467 | |
| DATED | : December 1, 2015 | |
| INVENTOR(S) | : Aikawa et al. | |

It is certified that error appears in the above-identified patent and that said Letters Patent is hereby corrected as shown below:

Title Page, Foreign Application Priority Data, Item (30)

Please change:

"Jun. 17, 2011 (JP) 2011-35312" to -- Jun. 17, 2011 (JP) 2011-135312 --

Signed and Sealed this
Second Day of August, 2016

Michelle K. Lee
*Director of the United States Patent and Trademark Office*